United States Patent [19]
Ferguson et al.

[11] Patent Number: 6,057,875
[45] Date of Patent: May 2, 2000

[54] REMOTELY CONTROLLED CABLE EQUALIZATION FOR IN-FLIGHT ENTERTAINMENT SYSTEMS

[75] Inventors: Bruce Robert Ferguson, Anaheim; James Bruce Whitehouse, Brea, both of Calif.

[73] Assignees: Sony Corporation, Tokyo, Japan; Sony Trans Com Inc., Irvine, Calif.

[21] Appl. No.: 08/579,183

[22] Filed: Dec. 27, 1995

[51] Int. Cl.[7] ........................................................ H03H 7/40
[52] U.S. Cl. ................................................. 348/8; 375/232
[58] Field of Search ..................................... 375/230, 232, 375/12, 14; 333/28 R, 18; 364/724.19, 724.02; 330/252, 254, 284, 285; 348/8

[56] References Cited

U.S. PATENT DOCUMENTS

| | | | |
|---|---|---|---|
| 4,759,035 | 7/1988 | McGary et al. | 333/18 |
| 4,888,560 | 12/1989 | Ogura | 330/254 |
| 5,214,505 | 5/1993 | Rabowsky et al. | 348/8 |
| 5,280,346 | 1/1994 | Ross | 358/38 |
| 5,481,564 | 1/1996 | Kakuishi et al. | 375/230 |
| 5,687,321 | 11/1997 | Allen | 395/200.11 |
| 5,745,159 | 4/1998 | Wax et al. | 348/8 |
| 5,844,941 | 12/1998 | Mack et al. | 375/232 |

*Primary Examiner*—Steven J. Saras
*Assistant Examiner*—Srilakshmi K. Kumar
*Attorney, Agent, or Firm*—Lisa A. Rode

[57] ABSTRACT

A remotely-controlled cable equalization system includes a control unit containing a non-volatile memory, a plurality of remote video display devices, each of which includes an adjustable cable equalization circuit, and an interface for connecting the control unit to each of the plurality of remote video display devices. Each of the plurality of remote video display devices includes a receiver for receiving a 12-bit digital code, from the control unit, through the interface. A 12-bit register is connected to the receiver and a 12-bit digital-to-analog converter is then connected to the 12-bit register, for receiving a 12-bit digital code from the 12-bit register and for converting the digital signal to an analog signal. The adjustable cable equalization circuit in each of the plurality of remote video display devices receives the analog signal from the 12-bit digital-to-analog converter and provides the necessary cable equalization for each of the plurality of remote video display devices based on the received analog signal.

5 Claims, 2 Drawing Sheets

REMOTELY CONTROLLED CABLE EQUALIZATION FOR IN-FLIGHT ENTERTAINMENT SYSTEMS

FIELD OF THE INVENTION

This invention relates to the field of cable equalization. More particularly, this invention relates to a remotely-controlled cable equalization system for use in aircraft in-flight entertainment systems.

BACKGROUND OF THE INVENTION

In many situations, color video is transmitted down long lengths of coaxial or twisted-pair cable. Cable losses vary depending on the cable length between a video source and a display device. If left uncompensated, cable losses will degrade the picture quality. It is a difficult process to manually adjust the cable equalization once a system, having a single video source with multiple display devices, has been installed in an aircraft.

The problems of cable equalization have been addressed in the past in various yet undesirable ways, including (1) keeping the cable lengths short, so that cable equalization is not required; (2) an alternative approach for longer cable lengths is to provide a fixed amount of amplification that overcompensates short cables and under-compensates long cables, which improves the picture quality at long lengths, while degrading it somewhat at short cable lengths; and (3) manually adjusting the cable equalization for each remote display device after system installation.

Therefore, in order to eliminate the shortcomings of each of the three attempted "solutions" described above, it is an object of the present invention to provide a system that allows cable equalization to be tailored for the specific cable lengths on a particular model of an aircraft.

It is a further object to provide a system in which the cable equalization amplification function required for each remote video display device can be set remotely by a centrally-located system controller during the system initialization.

It is a still further object to provide a system in which the programming information required to initialize the cable equalization amplifier in each remote video display device can be stored in a memory device in the centrally-located system controller, which eliminates the need to manually set amplification values in the remote video receiver.

SUMMARY OF THE INVENTION

The present invention relates to a remotely controlled cable equalizer, in which the programming information, required to initialize the cable equalization amplifier in each remote video receiver can be stored in a memory device in the centrally-located system controller, which eliminates the need to manually set amplification values in the remote video display device.

In another aspect of the invention, the cable compensation could be made fully automatic with additional circuitry. The additional circuitry would contain a servo loop to adjust the equalizer amplification based on the attenuation of a calibrated portion of the signal, such as the burst portion of an NTSC formatted video signal.

DETAILED DESCRIPTION OF THE INVENTION

Figure 1:
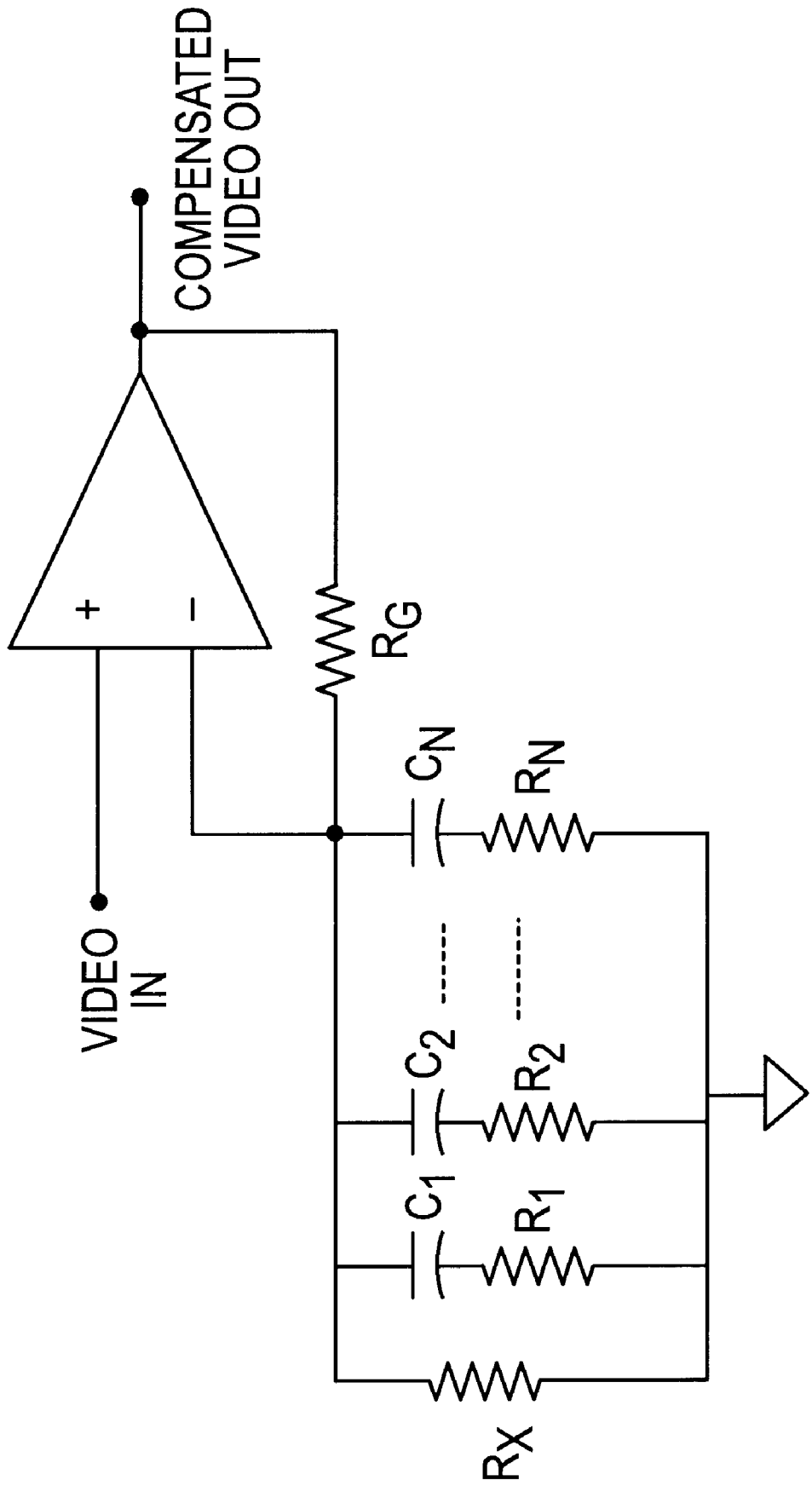
FIG. 1 depicts a cable equalization filter, for providing a maximum set amount of cable equalization, in accordance with the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiment shown and described. In the description below, like reference numerals are used to described the same, similar or corresponding parts in the several views of the drawings.

When wideband video signals are routed over long lengths of twisted pair cable, the signal is degraded such that the video display device cannot accurately display the video picture. The signal degradation results from amplitude losses that are frequency dependent and increase as a function of the cable length. The display distortion appears as a loss of display resolution and for longer cable lengths can result in a loss of horizontal synchronization. Since video routing lengths vary, depending on where the display is located on the aircraft, the amount of signal degradation varies as well. Optimizing the amount of cable equalization at each display location is a difficult task for the system installer.

This invention provides a means for remote control of the amount of cable equalization applied to a given video display from a central location on the aircraft and may be preprogrammed for optimization on any type of commercial aircraft. The cable equalization provides compensation for the resistive losses and skin effect losses for cable lengths up to 300 feet, which is the maximum video routing length expected for in-flight entertainment systems installed on commercial aircraft.

In a preferred embodiment, the present invention provides a cable equalization filter capable of supplying compensation for up to 300 feet of #24 AWG twisted shielded pair cable (FIG. 1). This cable equalization filter is used in conjunction with a two-input video fader circuit to provide variable cable compensation that can be remotely-controlled (FIG. 2).

Specifically, referring to the cable equalization filter shown in FIG. 1, an amplifier has a plurality of frequency equalizing components, $R_1$–$R_N$ and $C_1$–$C_N$, in parallel with the gain resistor $R_G$ and resistor $R_X$. The equalization component values are chosen based on the maximum length of the cable in a predetermined system, which determines the required maximum depth of equalization. The distorted input video signal is compensated by the circuitry shown in FIG. 1, and the compensated video signal is output from the amplifier.

Figure 2:
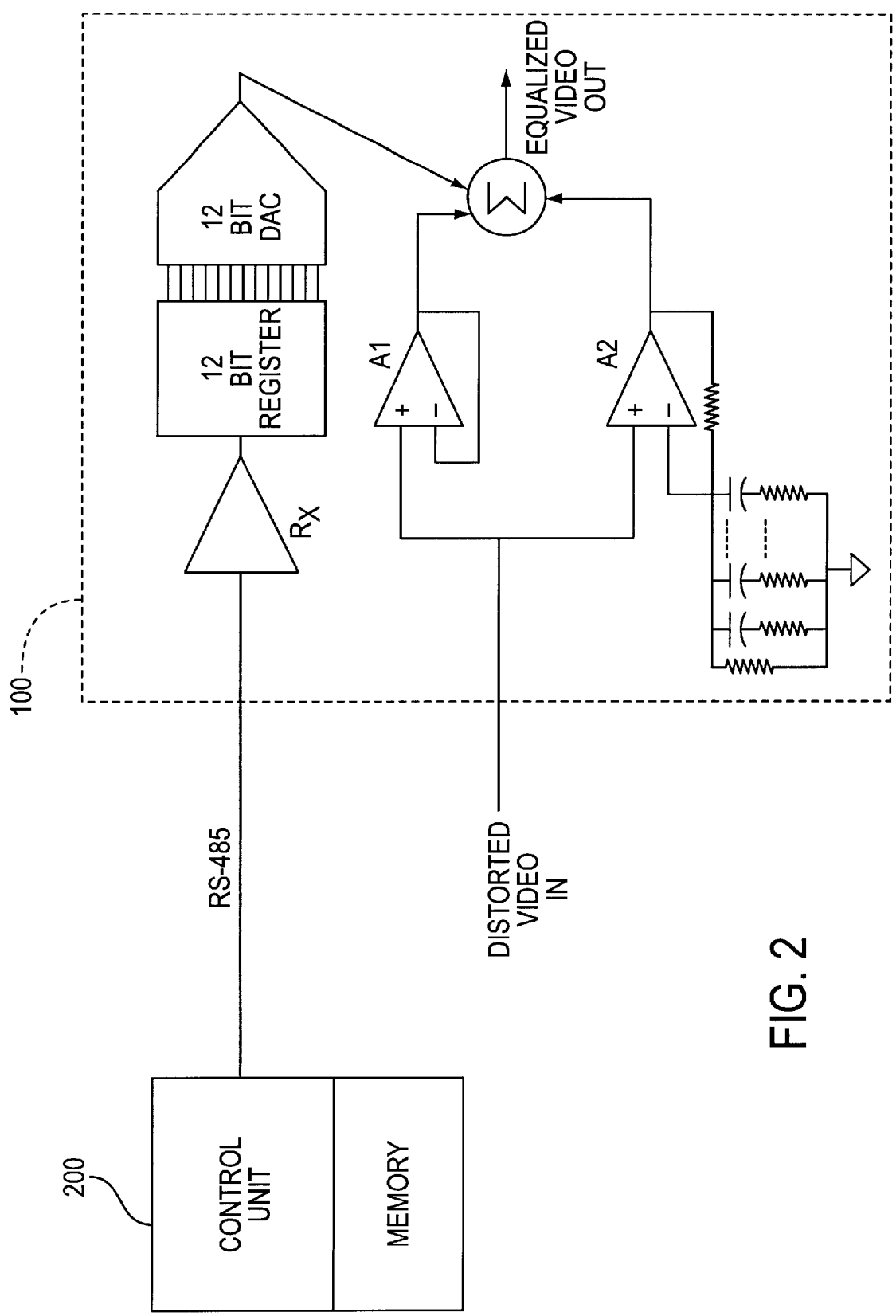
FIG. 2 depicts the remote control of variable cable equalization, utilizing the cable equalization filter shown in FIG. 1, in accordance with the present invention.

Referring to FIG. 2, which incorporates the cable equalization filter illustrated in FIG. 1, remote control is accomplished over an RS-485 interface between a plurality of remote video display devices 100 (note that only one such display device is shown for illustration purposes), and a central control unit 200 (it should be noted that the RS-485 interface is also utilized to turn on and off each respective remote video display device). The digital interface RS-485 is used to transmit a 12-bit code, indicative of each of the cable lengths to each of the respective video display devices, to the remotely-located cable equalization circuitry of each respective display device. The 12-bit code is received by receiver Rx and is loaded into a 12-bit register which drives a digital-to-analog converter (DAC). The analog output of the DAC controls the gain weighting of the video fader. The video fader amplifier provides an output that is proportional to the weighted sum of its two parallel channels. In this application, one of the channels A1 is a unity gain buffer and the other A2 is set to equalize 300 feet of cable, At one extreme, no cable compensation is provided and at the other extreme, compensation for 300 feet is provided. Other cable lengths are compensated by loading the 12-bit DAC with values between the two extremes.

In accordance with the present invention, the analog signal output from the DAC is applied to the video fader circuit such that it provides a control signal (or a control 'voltage') which is compared to a reference voltage, and which indicates the required weighting of the two separate input channels, or the two amplifiers of the video fader. For example, assuming that the unity gain amplifier A1 is "amplifier A" and the maximum equalization amplifier A2 is "amplifier B", if the video display device in question is the maximum distance from the control unit, the DC analog voltage output from the DAC indicates to the video fader that the weighting required for correct equalization is 0% of amplifier A, and 100% of amplifier B. On the other hand, if the video display device in question is at the control unit, with no cable length between the two, the DC analog voltage output from the DAC indicates to the video fader that the weighting required for correct equalization is 100% of amplifier A, and 0% of amplifier B. It follows that for any length of cable between zero and the maximum set length, the DC analog voltage output from the DAC will indicate to the video fader the weighting required for correct equalization between amplifier A, and amplifier B.

Thus, it is apparent that in accordance with the present invention, an apparatus that fully satisfies the objectives, aims and advantages is set forth above. While the invention has been described in conjunction with the specific embodiments, it is evident that many alternatives, modifications, permutations and variations will become apparent to those skilled in the art in light of the forgoing description. Accordingly, it is intended that the present invention embrace all such alternatives, modifications and variations as fall within the scope of the appended claims.

What is claimed is:

1. A remotely-controlled cable equalization system, comprising:
    a control unit containing non-volatile memory means;
    a plurality of remote video display devices, each of which includes an adjustable cable equalization circuit and a receiver for receiving control data from said control unit;
    wherein the adjustable cable equalization circuit includes two amplifiers, one comprising a unity gain buffer with no frequency equalization and the other comprising a cable equalization filter which is set to equalize a maximum length of cable; and
    interface means for connecting said control unit to each of said plurality of remote video display devices.

2. A remotely-controlled cable equalization system according to claim 1 wherein said control data is 12-bit digital code.

3. A remotely-controlled cable equalization system according to claim 2 wherein each of said plurality of remote video display devices includes:
    a receiver for receiving a 12-bit digital code, from said control unit, through said interface means;
    a 12-bit register connected to said receiver; and
    a 12-bit digital-to-analog converter for receiving the 12-bit digital code from said 12-bit register and for converting the digital signal to an analog signal,
    wherein the adjustable cable equalization circuit in each of said plurality of remote video display devices includes means for receiving the analog signal from said 12-bit digital-to-analog converter and for providing the necessary cable equalization for each of said plurality of remote video display devices based on the received analog signal.

4. A remotely-controlled cable equalization system according to claim 3, wherein said 12-bit code represents the cable length corresponding to each of said plurality of remote video display devices.

5. A remotely-controlled cable equalization system according to claim 1, wherein said interface means is the RS-485 interface.

* * * * *